United States Patent [19]
Pedersen

[11] Patent Number: 6,066,960
[45] Date of Patent: May 23, 2000

[54] PROGRAMMABLE LOGIC DEVICE HAVING COMBINATIONAL LOGIC AT INPUTS TO LOGIC ELEMENTS WITHIN LOGIC ARRAY BLOCKS

[75] Inventor: Bruce B. Pedersen, San Jose, Calif.

[73] Assignee: Altera Corporation, San Jose, Calif.

[21] Appl. No.: 09/082,878

[22] Filed: May 21, 1998

Related U.S. Application Data

[60] Provisional application No. 60/047,454, May 22, 1997.

[51] Int. Cl.[7] .......................................................... G06F 7/38
[52] U.S. Cl. ............................... 326/39; 326/211; 326/38
[58] Field of Search ................................... 326/39, 38, 41

[56] References Cited

U.S. PATENT DOCUMENTS 3,473,160  10/1969  Wahlstrom .................................. 326/39
5,500,608   3/1996  Goetting et al. ........................... 326/39

OTHER PUBLICATIONS

*XILNX Databook*, 1994, pp. 8–62 to 8–121, pp. 8–152 to 8–158.

*Primary Examiner*—Michael Tokar
*Assistant Examiner*—Anh Tran
*Attorney, Agent, or Firm*—Charles J. Kulas; Townsend and Townsend and Crew, LLP

[57] ABSTRACT

AND gates are used at the inputs to logic elements in a programmable logic device. This allows more efficient configuration of the logic elements for basic functions such as a multiplier, clearable counter and multiplexer. Inputs to the AND gates are enabled by LAB-wide control signals that are distributed to several logic elements within a logic array block. The control signals can also be generated from a RAM or ROM, or by decoding existing control signals.

7 Claims, 9 Drawing Sheets

One configuration RAM per LUT input.

Fig. 5  Diagram showing "adder-tree" for a 16-bit multiplier

LE configured for 4-1 multiplexer

Decoder for generating LAB-wide signals

One configuration RAM per LUT input.

One "AND-gate" control RAM per LE 6,066,960

PROGRAMMABLE LOGIC DEVICE HAVING COMBINATIONAL LOGIC AT INPUTS TO LOGIC ELEMENTS WITHIN LOGIC ARRAY BLOCKS

This application claims priority from U.S. Provisional Patent Application Ser. No. 60/047,454 filed May 22, 1997.

BACKGROUND OF THE INVENTION

This invention relates in general to digital logic circuits and more specifically to using combinational logic and control signals at the inputs to logic elements in a programmable logic device.

Programmable logic devices (PLDs) represent a compromise in digital circuit design. By providing a standard architecture that uses many logic elements (LEs) capable of performing basic logic functions, and by allowing flexible interconnection of these logic elements and other resources, a PLD provides a circuit designer with the ability to specify which functions the logic elements perform and the interconnection among logic elements to achieve different design goals. For example, PLDs can be configured to perform tasks such as controllers, processors, and other digital systems. Because a PLD uses predesigned functions, a design implementation may not be as efficient as a fully custom design. However, the time to achieve the design is much less since a new device does not have to be fabricated.

One example of a PLD is the "FLEX" series of devices manufactured by Altera Corporation. An example of a specific device is called the FLEX 10K. A discussion of this device can be found in the Altera Data Book, published by Altera Corporation, 1996, which is incorporated herein by reference. FIG. 1A shows a block diagram of a basic configuration of a FLEX 10K PLD. As shown in FIG. 1A, the PLD 10 includes an embedded array 12 having two embedded array blocks (EABs). The embedded array is used to implement memory and specialized logic functions. For example, random access memory (RAM), read-only memory (ROM), and first-in, first-out (FIFO) functions can be implemented. Each EAB can contribute 100 to 600 gates toward complex logic functions such as multipliers, microcontrollers, state machines, digital signal processing (DSP) functions, etc.

A logic array consisting of logic array blocks (LABs) such as LAB 16 is provided. Each LAB is, in turn, made up of eight logic elements (LEs) 18 and a local interconnect 20. Each LAB can be used to create medium-sized blocks of logic—such as 8-bit counters, address decoders, or state machines—or combinations of LABs can be formed to create larger logic blocks. Each LAB represents about 96 useful gates of logic.

Row and column interconnections are shown such as row interconnect 22 and column interconnect 24. These connection channels provide fast input and output between the input/output elements (IOEs) and LEs.

FIG. 1B is an expanded block diagram of a LAB, for example, LAB 16 shown in FIG. 1A.

As shown in FIG. 1B, each LAB is provided with a LAB local interconnect 40 that provides four input signals to each of the eight LEs comprising the LAB. Also, four LAB control signals 42 are provided to each LE. Each LE is provided with a Carry-In and Cascade-In which are propagated from LE to LE and can be chained to other LEs in other LABs. Output from the LEs is channeled back to LAB local interconnect 40 or can be routed to column or row interconnects for purposes of sending to other LABs, the EABs or IOEs. Routing to other LABs is via the LAB local interconnect 40 connection to the row interconnect or the LAB control signals 42 connection to the row interconnect as shown. In this manner, signals can be shared and distributed among all elements of the PLD.

FIG. 1C shows details of an individual LE, such as LE1 of FIG. 1B. In FIG. 1C, the data signals coming from the LAB local interconnect are shown at 60. Control signals coming from LAB control signals are shown at 62. Similarly, the Carry-In, Cascade-In and outputs from the LE are shown. The LE is, conceptually, the smallest unit of logic in the FLEX 10K architecture. Each LE contains a four-input lookup table (LUT), which is a function generator that can quickly compute any function of four variables. In addition, each LE contains a programmable flipflop with a synchronous enable, a carry chain, and a cascade chain. Each LE drives both column and row interconnects so that outputs from the LE can be routed to other LEs, to the EABs, output pins or other components.

Typical functions that are implemented in a PLD are multipliers, multiplexers, counters, etc. While the PLD is a good compromise in design flexibility and rapid implementation, there are inevitably wasted resources (i.e., gates) in adapting the predefined logic of a PLD to a specific circuit design. For example, in order to implement a 16-bit adder, many single bit summations must occur. Each summation uses an entire LE as shown in FIG. 1D. Other functions such as a clearable up/down counter or multiplexer suffer from similar design constraints that require a large number of LEs to be used to implement very basic operations.

Thus, it is desirable to improve the flexibility of PLDs of the architecture described, or similar architecture, so that operations such as multiplications and other functions can be performed with less gates in the PLD. Additionally, the improvement should not result in an undue increase in the number of gates in the PLD or the complexity of implementing a design in the PLD.

SUMMARY OF THE INVENTION

The present invention uses combinational logic at the inputs to logic elements in a programmable logic device. In one embodiment, two AND gates are used at two inputs to an LE. This allows more efficient design of a multiplier, clearable up/down counter or multiplexer. Other embodiments allow control signals to be generated to be applied to the AND gates. Such control signals can be derived from existing control signals or random access memory (RAM) on the PLD.

DESCRIPTION OF THE PREFERRED EMBODIMENT

Figure 1A:
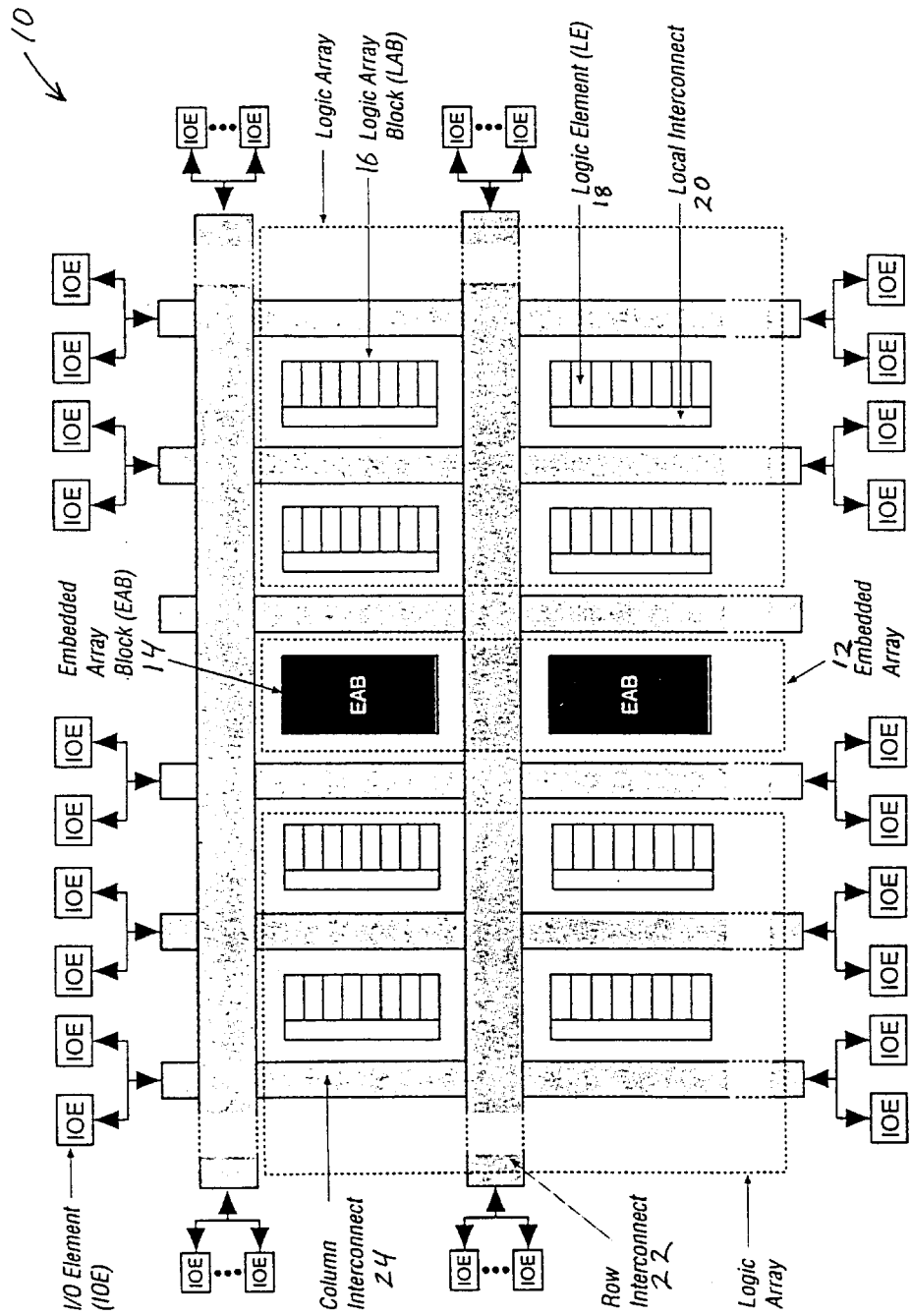
FIG. 1A is a Prior Art diagram of a programmable logic device (PLD)
Figure 1B:
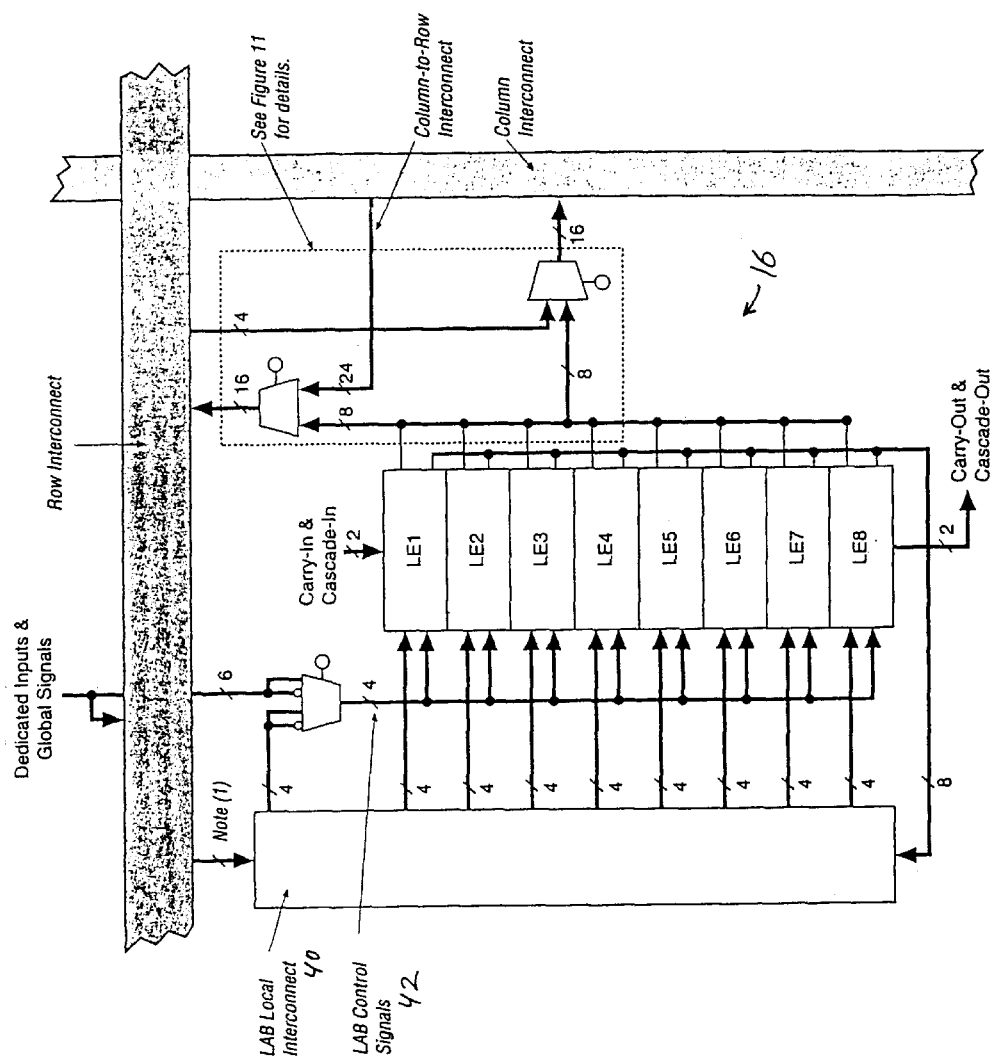
FIG. 1B is a Prior Art diagram of a detail of a logic array block of the PLD of FIG. 1A.
Figure 1C:
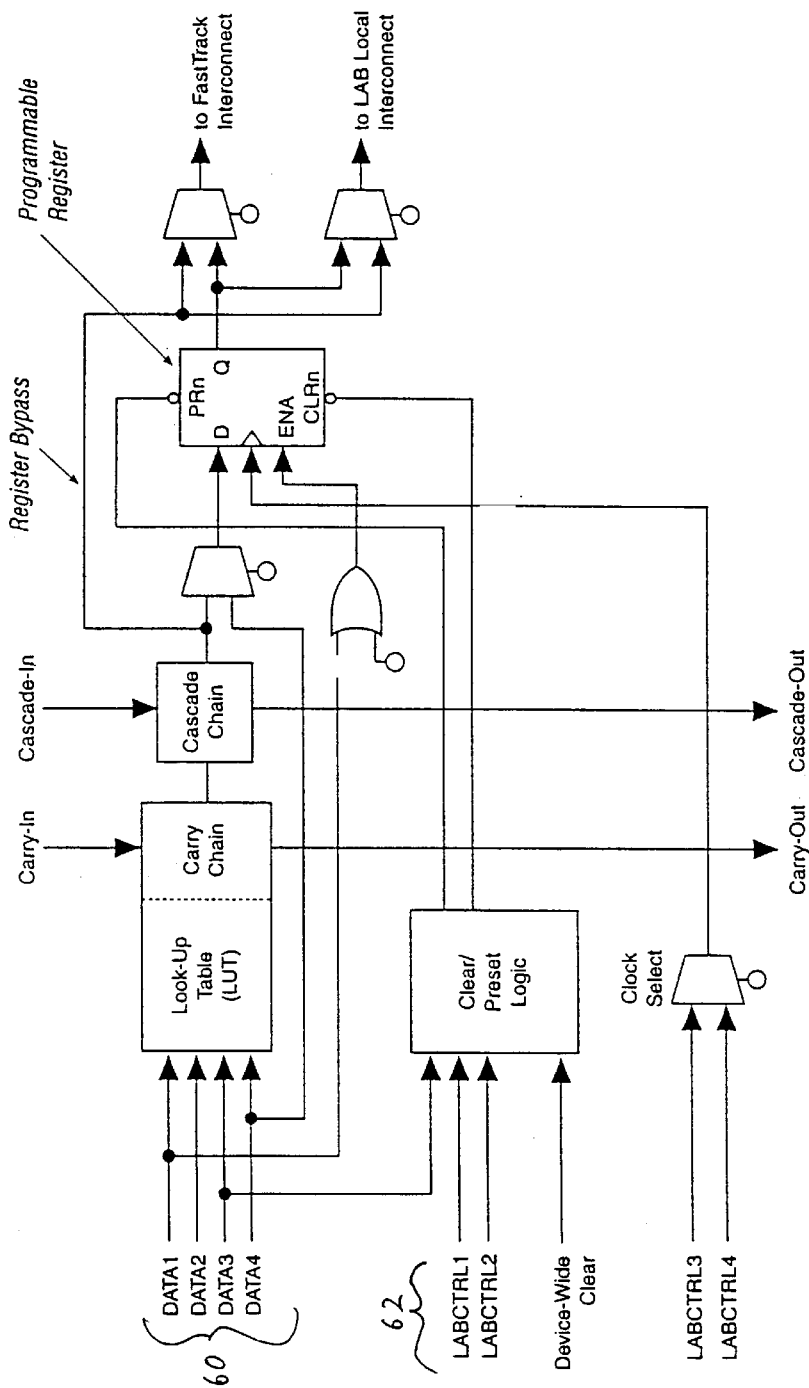
FIG. 1C is a Prior Art diagram of a detail of a Logic Element of the LAB of FIG. 1B.
Figure 1D:
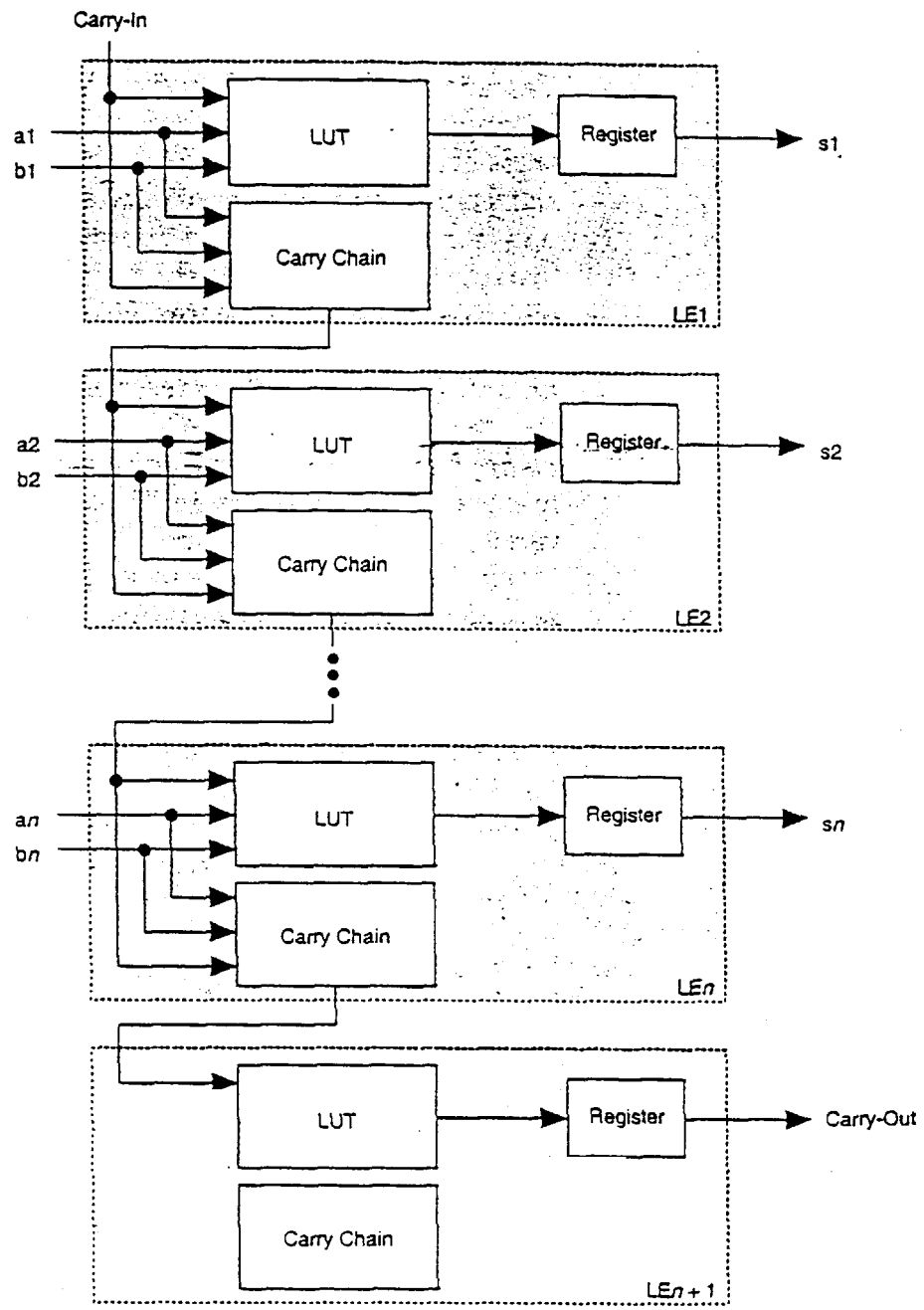
FIG. 1D is a diagram showing Logic Elements in the PLD of FIG. 1A configured to implement an adder.
Figure 2:
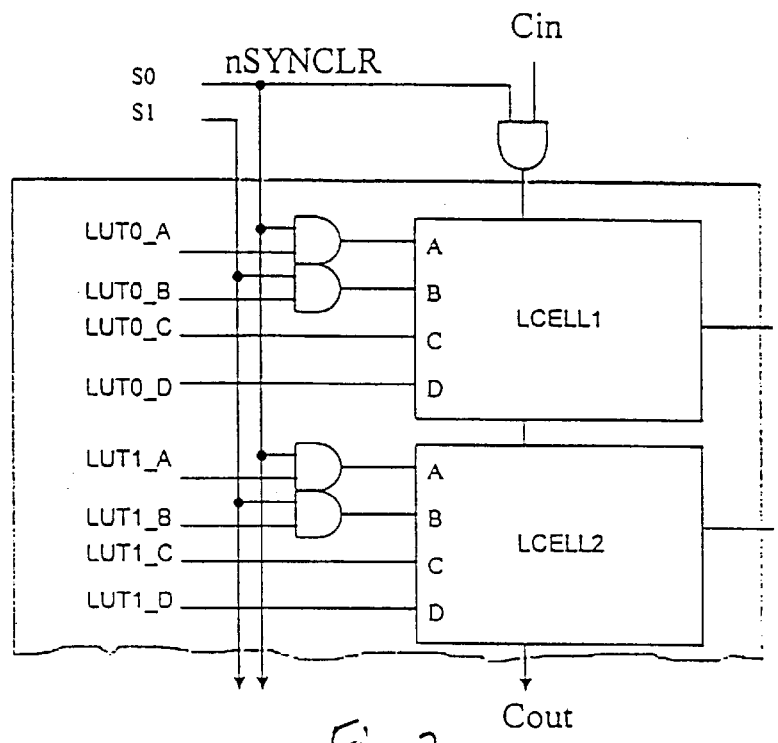
FIG. 2 shows an LCELL with LAB-wide control signals feeding AND gates according to the present invention.

FIG. 2 shows logic cells (LCELLs) corresponding to logic elements (LEs) of FIG. 1B. In FIG. 2, however, AND gates are coupled to two of the four inputs at each of the LCELLs. Thus, inputs A and B in each of the LCELLs accept the traditional look-up table (LUT) input and also accept an enabling signal that is a LAB-wide signal. That is, the enabling, or control, signal feeds each analogous input in all of the LCELLs (i.e., LEs) in the LAB.

Typically there are 8 LCELLs in a LAB so, although only two are shown in FIG. 2, S0 will feed the A inputs to each of the 8 LCELLs in the LAB. Similarly, S1 enables each of the B inputs to all of the LCELLs in the LAB. As described above, the LCELLs, or LEs, can be configured as one-bit adders to add the LUTx_A and LUTx_B signals and to provide a fast carry-out cascaded among the LCELLs in the LAB. In order to implement a long-word multiplication, many such additions are required. However, the present invention's use of the configuration shown in FIG. 2 allows a logical AND summing to be performed as the first step in the multiply.

Figure 3:
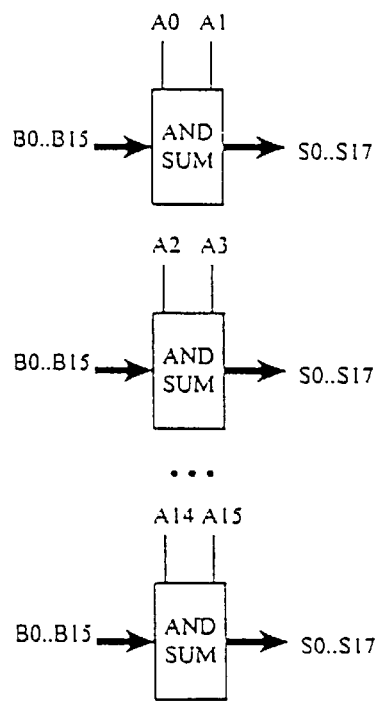
FIG. 3 illustrates the input signal configuration for a partial sum in a multiplier.

FIG. 3 shows how the input signals of the LABs of the present invention are configured for a 16-bit multiply. The 16 bit "A" multiplier inputs are applied as the LAB-wide enable signals S0 and S1 of FIG. 2. That is, A0 and A1 are the S0 and S1, respectively, control inputs. B0 and a 0 input are applied as LUT0_A and LUT0_B, respectively, in the first LE. In the second LE, A0 and A1 are applied identically with the first LE and the LUT1_A and LUT1_B inputs are B1 and B0, respectively. This is shown in FIG. 4.

Figure 4:
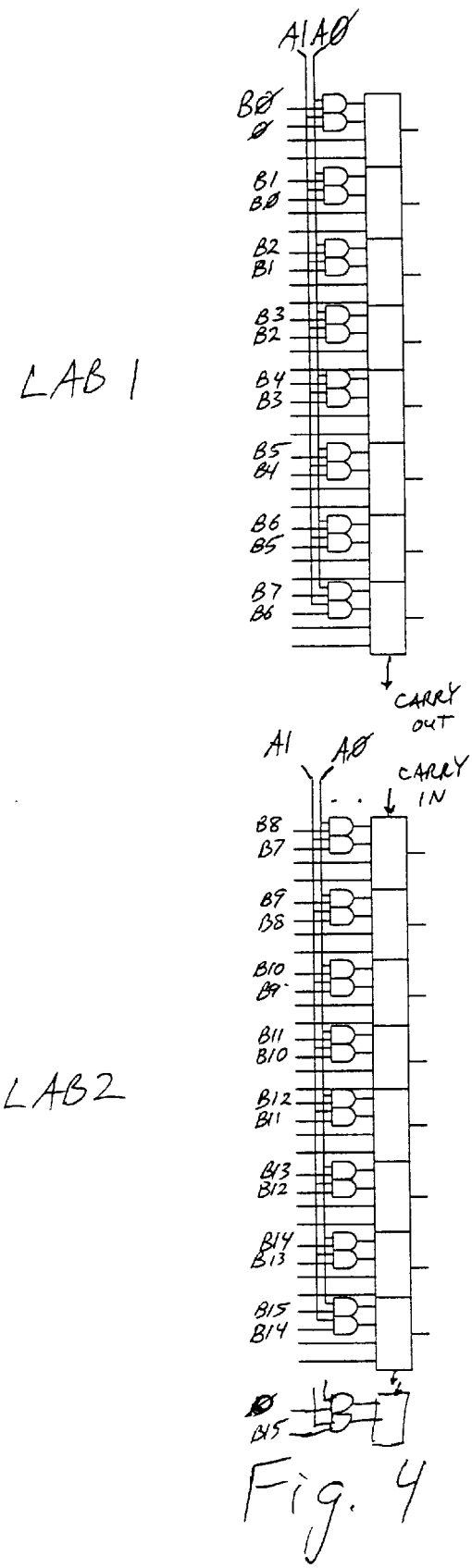
FIG. 4 shows details of the input signal configuration of FIG. 3.

FIG. 4 shows two bits of the multiplier, A0 and A1, applied to an AND sum for B0–B15. Naturally, this would be repeated seven more times to handle the A2–15 bits. Note that a portion of a third LAB is needed to handle the last bit product. Depending on the specifics of the PLD, for example the number of LEs per LAB, the AND summing of a 16 bit word may bridge 1–3 LABS.

Figure 5:
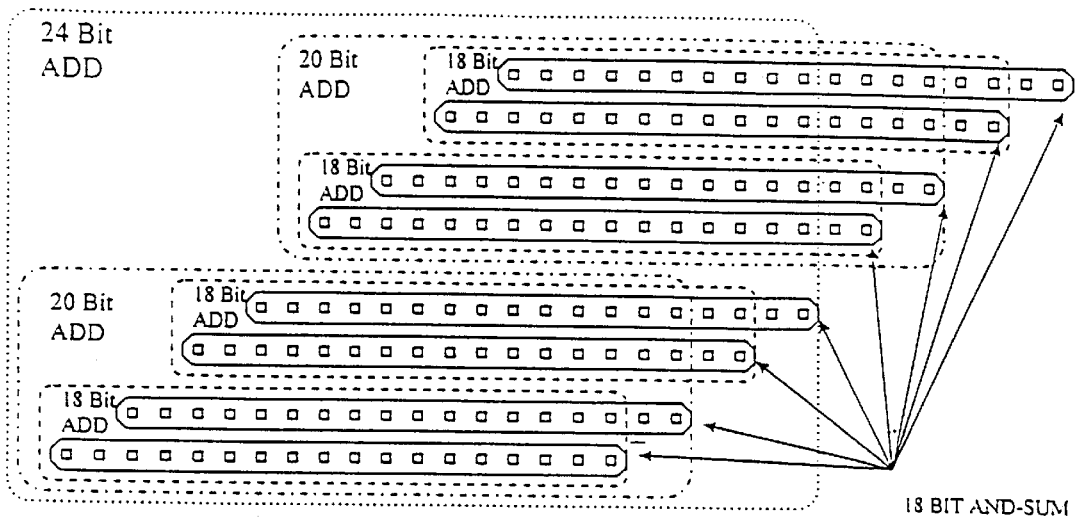
FIG. 5 illustrates an adder-tree for a multiply operation.

In order to multiply two N-bit numbers (A1 . . . An) and (B1 . . . Bn) together there will be N/2 adders having (N+2) bits each required to generate (N/2) partial sums in parallel. Then, (N/2)–1 adders having (N+2) bits each will be used to generate a $\log_2$ (N/2) level binary adder tree to add the partial sums together. This is illustrated in FIG. 5.

Table I lists the number of LCELLs and delays encountered with this approach.

TABLE I

| 8 | 18-Bit AND-SUM |
|---|---|
| 4 | 18-Bit Aders |
| 2 | 20-Bit Adders |
| 1 | 24-Bit Adder |
| Total: 280 LCELLs, 4 LCELL Delays, 31 Carry Delays. | |

In the prior example, two of the inputs to the lookup table are fed by two-input AND gates. OR gates may also be used. Or any suitable arrangement of simple combinational logic. One of the inputs to each of the AND gates comes from a general interconnect (or "global" interconnect), while the second input comes from a LAB-wide signal that is common to each of the cells in a given LAB. Thus, if a look-up table had four AND gates feeding its four inputs, then there are four LAB-wide signals in each LAB. Each signal feeding a different AND gate on each LUT.

FIG. 2 shows that an AND gate can be used at the carry-in to a LAB so that the carry-in is disabled whenever one of the LAB-wide signals is low. In this case, the LAB-wide signal (S0) need not also be used as an enable at the A inputs. Then the LAB-wide signal (S0) can be used as a synchronous clear for logic elements that need to implement a clearable UP/DOWN counter.

Figure 6:
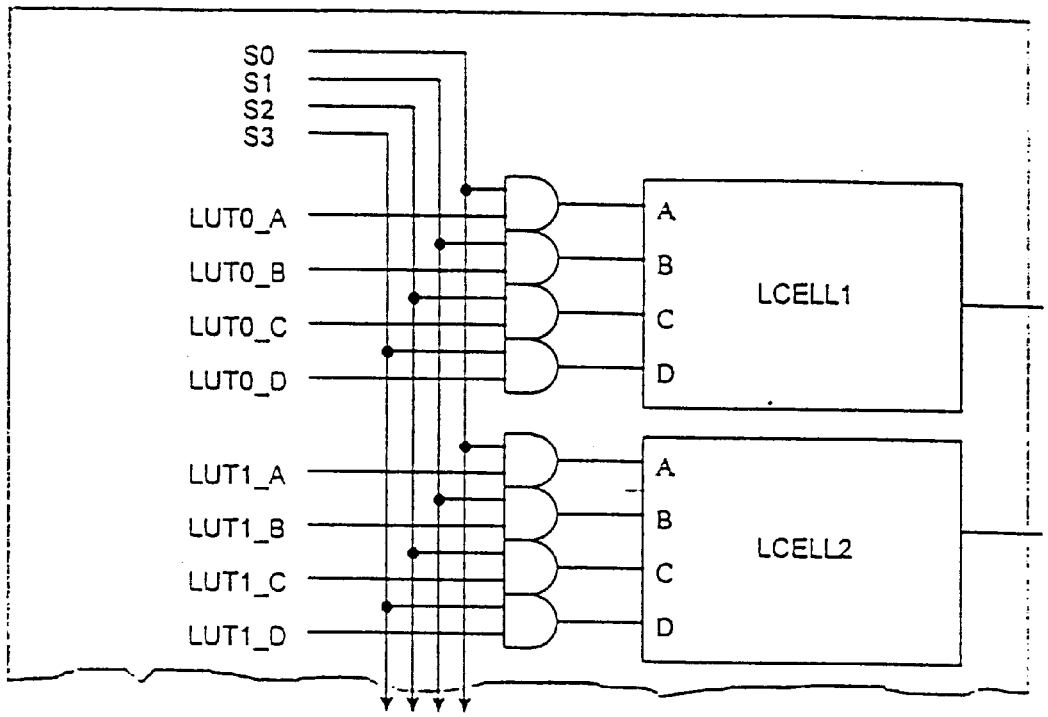
FIG. 6 shows a logic element configured for a 4-1 multiplexer.
Figure 7:
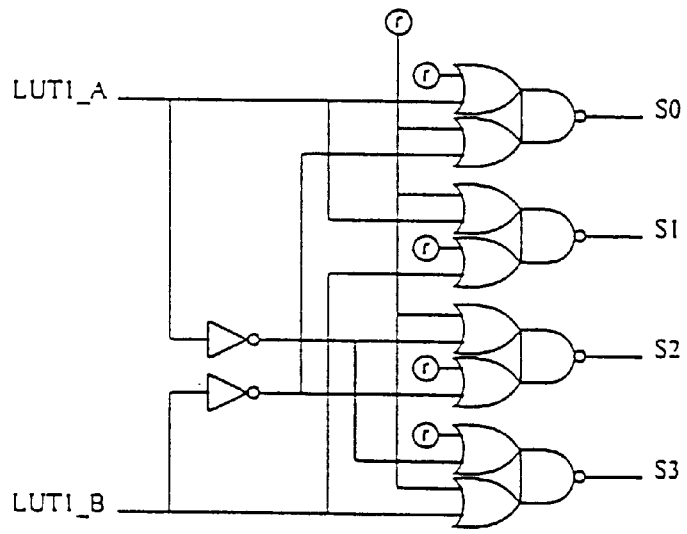
FIG. 7 shows a decoder for generating LAB-wide signals.

FIG. 6 shows an application where each input to the 4-input LUT uses an AND gate. This allows a 4-input mux to be implemented in a single LUT by programming the four LAB-wide signals S0-3 to be the four select lines for the mux and programming the look-up table to OR all of its inputs together. To make this more efficient, extra hardware can be added to each LAB to generate these four lab-wide signals by decoding two signals taken from the general interconnect, as shown in FIG. 7. This modified logic element can implement many other useful functions having up to eight inputs, where four of the eight signals are LAB-wide signals.

Figure 8:
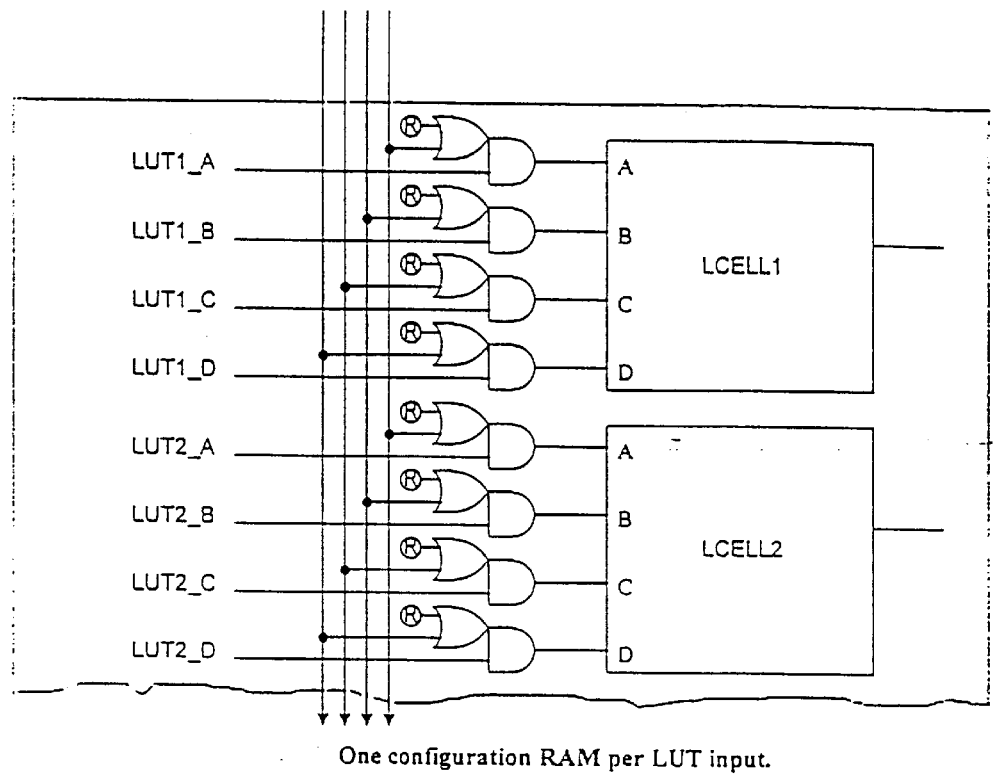
FIG. 8 shows a configuration RAM used to generate control signals.
Figure 9:
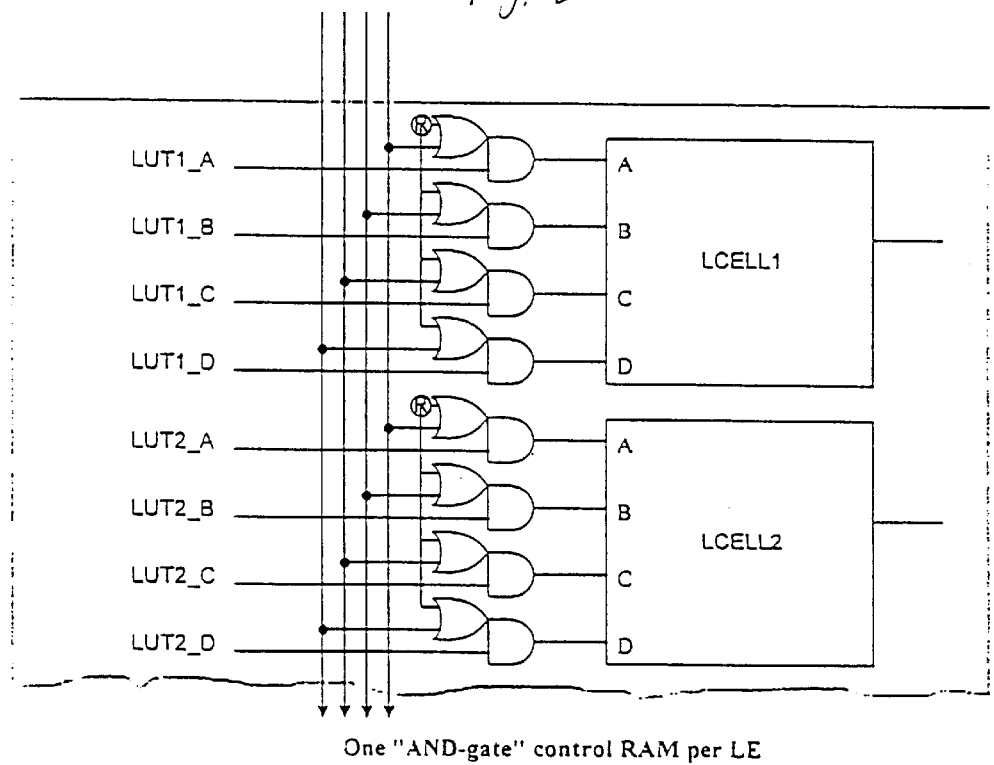
FIG. 9 is a variation on using a configuration RAM to generate control signals.

Other control schemes are possible. For example, FIG. 8 shows a control where each AND gate is independently controllable by having a programming element for each AND gate. The signals designated by "R" are coupled to programmable RAM or ROM in the PLD. FIG. 9 shows the case where only one programmable element is used for each LCELL. Many other variations are possible.

Thus, the invention has been discussed with respect to various embodiments thereof. However, many variations on the embodiments are possible which remain within the scope of the invention. The disclosure is to be regarded as illustrative, not restrictive of the invention, the scope of which is determined by the appended claims.

What is claimed is:

1. A programmable integrated circuit comprising:
   a first-level plurality of programmable interconnect;
   a plurality of logic array blocks (LABs), a logic array block comprising:
      a plurality of programmable logic cells for implementing logical functions, the logic cells having a plurality of inputs programmably coupled to the first-level plurality of programmable interconnect;
      a logic gate coupled between the first-level of plurality of programmable interconnect and a first logic cell of the plurality of logic cells; and
      a local control signal coupled to all programmable logic cells in the LAB.

2. The programmable integrated circuit of claim 1 further comprising:
   a carry chain cascaded through the plurality of programmable logic cells, wherein the local control signal is coupled to the carry chain.

3. A logic array block for a programmable integrated circuit comprising:
   a plurality of logic array inputs;
   a logic array block (LAB), the logic array block including
      a plurality of programmable logic cells, the logic cells having a plurality of logic cell inputs; and
      a plurality of LAB-wide control signals coupled to each of the plurality of programmable logic cells in the LAB to selectively enable and disable coupling of the logic array inputs to the plurality of logic cell inputs.

4. The logic array block of claim 3 further comprising:

a plurality of logic gates, one logic gate having inputs coupled to one of the plurality of control signals and one of the plurality of logic array inputs, and outputs coupled to one of the plurality of logic cell inputs.

5. The logic array block of claim 3 further comprising:

a plurality of logic gates, one logic gate having inputs coupled to one of the plurality of control signals and one of the plurality of logic array inputs, and outputs coupled to one of the plurality of logic cell inputs;

a plurality of programmable cells, at least one cell coupled to each of the plurality of logic gates.

6. The logic array block of claim 3 further comprising:

a plurality of logic gates, one logic gate having inputs coupled to one of the plurality of control signals and one of the plurality of logic array inputs, and an output coupled to one of the plurality of logic cell inputs;

a plurality of programmable cells, one cell coupled to the plurality of logic gates coupled to one of the plurality of logic cell.

7. A programmable logic device comprising:

at least one logic array block (LAB) including the following:

a plurality of logic cells, each logic cell having inputs and outputs;

an interconnect bus coupled to the inputs and outputs and transmitting a control signal;

a global control signal derived from the control signal on the interconnect bus;

combinational logic coupled between the interconnect bus and the logic cells; and wherein the global control signal is coupled to every logic cell in the LAB through the combinational logic.

* * * * *